United States Patent

Duncan

[15] 3,683,241

[45] Aug. 8, 1972

[54] RADIO FREQUENCY TRANSISTOR PACKAGE

[72] Inventor: David M. Duncan, San Francisco, Calif.

[73] Assignee: Communication Transistor Corp., San Carlos, Calif.

[22] Filed: March 8, 1971

[21] Appl. No.: 121,908

[52] U.S. Cl. ....................317/234, 317/101, 174/52
[51] Int. Cl. ....................H01l 1/02
[58] Field of Search ....................317/101, 234 Q

[56] References Cited

UNITED STATES PATENTS

| | | | |
|---|---|---|---|
| 3,265,982 | 8/1966 | Wilhelmsen | 330/23 |
| 3,312,771 | 4/1967 | Hessinger et al. | 174/52 |
| 3,408,542 | 10/1968 | Dautzenberg et al. | 317/235 |
| 3,544,857 | 12/1970 | Byrne et al. | 317/234 |

*Primary Examiner*—James D. Kallam
*Attorney*—Stanley Z. Cole

[57] ABSTRACT

A transistor die is mounted over a pair of mutually opposed ceramic filled microstrip lines having a common ground plane, one of these strip lines being an input strip line and the other being an output strip line. An extention of the common ground plane member extends up through the dielectric fill material of the strip lines into the gap between the mutually opposed ends of the adjacent strip lines to form a common connector terminal. Two sets of leads interconnect the common connector terminal and the input strip line with the base and the emitter electrodes on the transistor die, whereas the collector electrode of the transistor die is electrically and thermally connected to the output strip line.

10 Claims, 6 Drawing Figures

INVENTOR.
DAVID M. DUNCAN
BY
Stanley Z. Cole
ATTORNEY

INVENTOR.
DAVID M. DUNCAN

BY Stanley Z. Cole
ATTORNEY

RADIO FREQUENCY TRANSISTOR PACKAGE

DESCRIPTION OF THE PRIOR ART

Heretofore, microwave transistor chip measuring circuits have been proposed wherein an input microstrip line is mutually opposed to a output microstrip line, such lines being filled with a 10-mil thick alumina dielectric fill and being mounted on a beryllia substrate. The input and output microstrip lines were spaced apart at their mutually opposed inner ends to define a gap therebetween. A transistor die was mounted to the beryllia substrate in the gap between the ends of the input and output microstrip lines. The input strip line was connected to the emitter electrode on the transistor die and the base electrode structure on the transistor die was connected by wire leads to the ground plane underlying and common to both the input and output microstrips, whereas the collector electrode was connected to the output conductor of the output microstrip line.

Such a transistor measuring circuit is disclosed in the first quarterly progress report for Oct. 6, 1969 to Jan. 5, 1970 titled "Production Engineering Measure Multistage Solid-State Power Amplifier" made under contract number DAAB05-70-CC-3108 with the U.S. Army Electronics Command Procurement and Production Directorate Industrial Engineering Division, 225 S. 18th St., Philadelphia, Pa., and published March, 1970, see pages 13 and 14.

The problem with this prior art microwave transistor die measuring fixture is that wire leads from the base electrodes on the transistor die were bonded at their ends to the ground plane in a relatively narrow gap between the side edge of the transistor die and the end of the respective input and output microstrip lines. It is relatively difficult to make bonds into such narrow gaps. Moreover, the collector electrode of the transistor required separate wire leads for bonding the collector electrode to the output strip line. In addition, the transistor die required special arrangements of plating to permit bonding of the collector leads to the top surface of the transistor die.

It is desired to obtain an improved radio frequency transistor package in which the base or emitter leads are more easily bonded to the common conductor and in which connection between the collector electrode and the output line is facilitated.

SUMMARY OF THE PRESENT INVENTION

The principal object of the present invention is the provision of an improved radio frequency transistor package.

In one feature of the present invention, a transistor die is mounted overlaying a solid dielectric filled microstrip line having mutually opposed input and output strip lines portions spaced apart at the inner ends to define a gap therebetween, and wherein an electrical connector structure passes up from the common ground plane through the gap between the mutually opposed ends of the strip lines for making electrical connection to either the base or emitter electrode structures of the transistor, whereby electrical connection of the transistor electrode structure to the input and output strip lines is facilitated.

Another feature of the present invention is the same as the preceding feature wherein the electrical connector structure passing through the gap includes a terminal strip to which the electrode structures are to be connected, as by wires.

In another feature of the present invention, the input and output strip line portions are formed by metalized strips on a ceramic wafer disposed to overlay a conductive ground plane member common to both input and output strip line portions, such input and output strip line portions being dimensioned to have a characteristic impedance less than 20 ohms.

In another feature of the present invention, the transistor die includes a collector electrode structure which is mounted overlaying and facing the output strip line, such transistor being mounted in electrical contact with and in heat exchanging relation with the output strip line.

In another feature of the present invention, the transistor die comprises a semi-conductive wafer having a pair of opposed major faces with the collector, base, and emitter electrodes disposed on a common major face. The die is mounted overlaying the strip lines with the collector, base, and emitter electrode structures facing toward the strip lines with the collector structure in registration with and in electrical contact with the output strip line portion, and the die bridging the gap between the opposed side edges of the input and output strip conductors of the strip lines.

Other features and advantages of the present invention will become apparent upon a perusal of the following specification taken in connection with the accompanying drawings, wherein:

DESCRIPTION OF THE PREFERRED EMBODIMENTS

Figure 2:
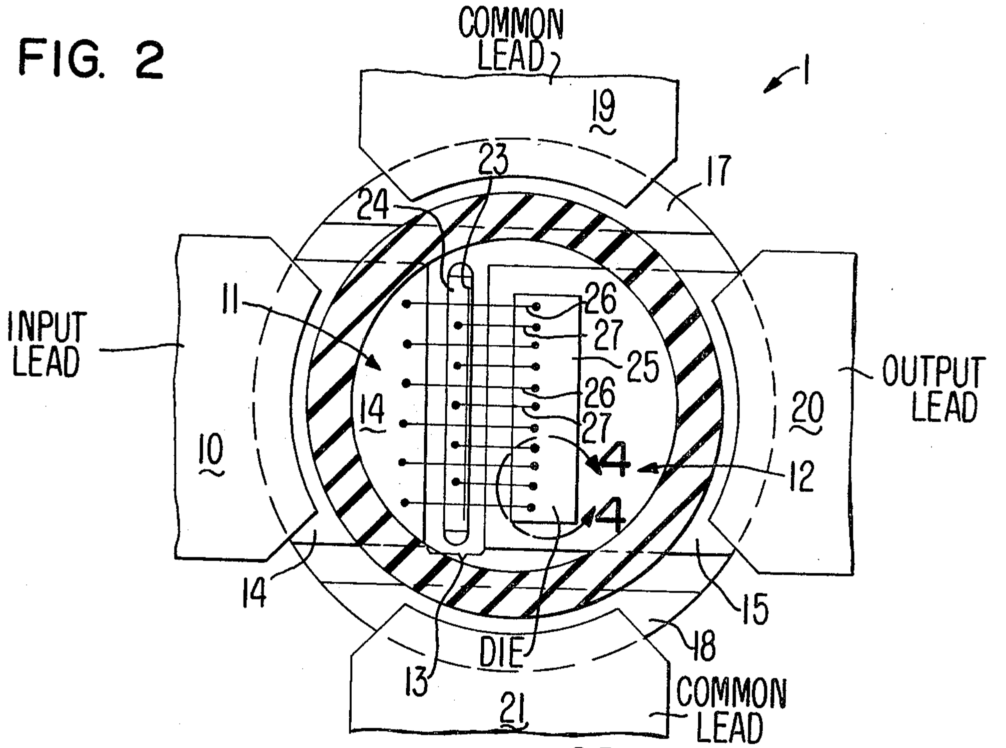
FIG. 2 is a sectional view of the structure of FIG. 1 taken along lines 2—2 in the direction of the arrows.
Figures 1, 3:
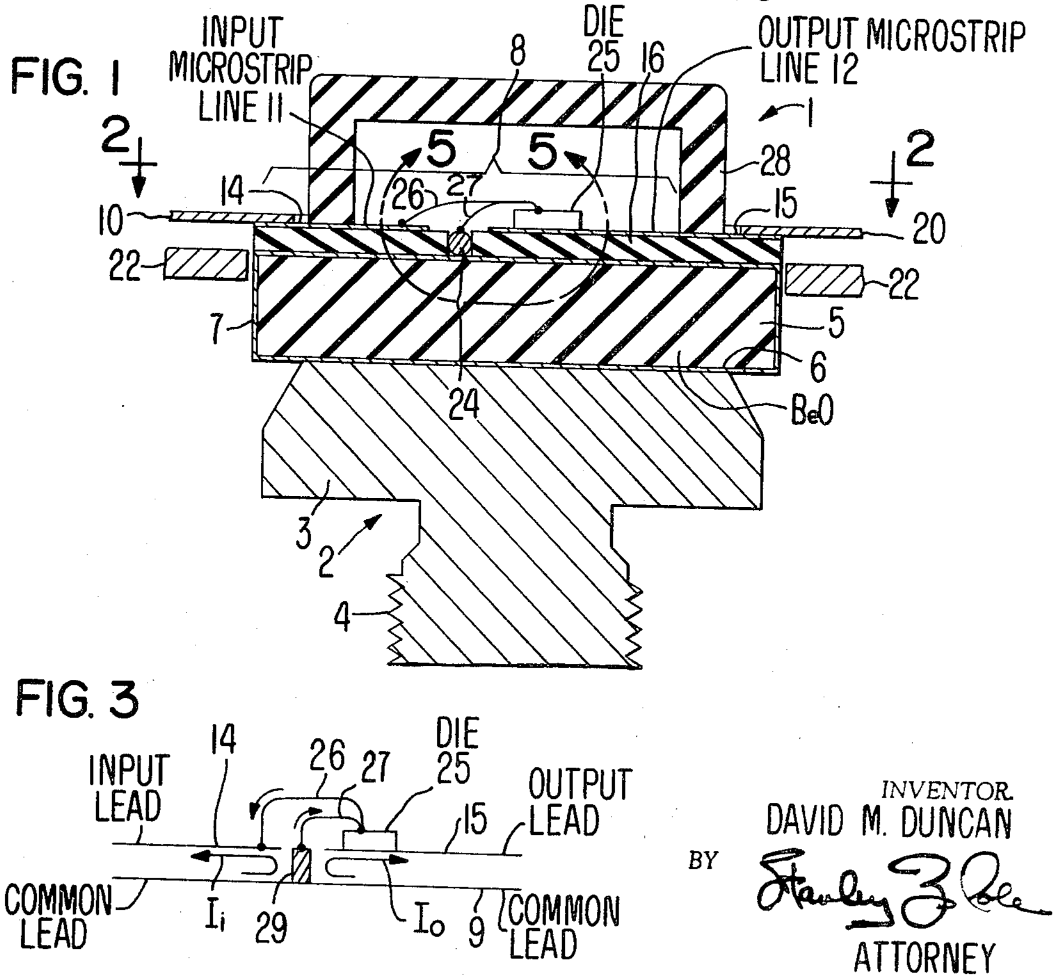
FIG. 1 is a longitudinal sectional view of a radio frequency transistor package incorporating features of the present invention.
FIG. 3 is a schematic circuit diagram for the electrical circuit of the structure of FIGS. 1 and 2.

Referring now to FIGS. 1 and 2, there is shown a radio frequency transistor package 1 incorporating features of the present invention. The transistor package 1 includes a heat sink structure 2 such as a copper stud 3, having a threaded portion 4 to be screwed into a threaded mounting hole in a suitable heat sink or circuit chassis, not shown.

A thermally conductive base plate structure 5, such as a metalized beryllia or alumina disc, is fixedly secured to the upper end of the stud 3, as by brazing at 6. In a typical example, the base plate 5 is 0.050 inch thick and 0.200 inch in diameter and is metalized over its entire outer surface with a suitably electrically conductive metalizing material such as molybdenum-manganese, plated with gold to an overall thickness, as of 0.001 inch.

A solid dielectric filled microstrip line structure 8 is fixedly secured to the top of the base plate 5 in heat exchanging relation therewith, as by brazing at 9. The microstrip line structure 8 includes an input microstrip line section 11 and an output microstrip line section 12 disposed in diametrically opposed relation, with the inner ends of the input and output microstrip lines 11 and 12 being spaced apart at their ends to define an elongated gap 13 therebetween. In a typical example, the gap 13 has a width as of 0.035 inch and a length of 0.0150 inch.

The microstrip line structure 8 is conveniently formed by metalizing an input strip line conductor 14 and an output strip line conductor 15 on the top surface of a beryllia wafer 16 as of 0.015 inch or less in thickness. Input and output strip leads 10 and 20 as of 0.005 inch thick and 0.0150 inch wide are bonded to the metalized conductors 14 and 15. The lower surface of the beryllia wafer 16 is also metalized over its entire surface to facilitate brazing to the base support 5 at 9. The lower metalized surface 9 of the beryllia wafer 16 forms a common ground plane conductor for both the input and output microstrip lines 11 and 12, respectively.

In a typical example, the wafer 16 has a diameter of 0.200 inch with the aforecited thickness of 0.010 inch. The input and output metalized strip line conductors 14 and 15 have a width of 0.150 inch, to yield characteristic impedances for the input and output microstrip lines of approximately 15 ohms. It is desired that such input and output microstrip line sections have a characteristic impedance of 20 ohms or less to facilitate impedance matching to high frequency transistor dies which have input and output impedances on the order of a few ohms or less.

The upper surface of the ceramic wafer 16 also has common conductor portions 17 and 18 metalized thereon and over the side edge to the lower surface 9 to facilitate grounding the transistor package 1 via grounding leads 19 and 21 bonded to the metalized common lead portions 17 and 18, respectively. In this manner, the common leads 19 and 21 and the input and output leads 10 and 20 are all located in the same plane to facilitate fabrication of the transistor package 1. The common leads 19 and 21 are connected at their outer ends, not shown, to a suitable ground plane portion of the circuit, such as a printed circuit board in which the transistor package 1 is to be mounted. The board is indicated at 22 in FIG. 1.

The ceramic wafer 16 is slotted at 23 to provide an elongated slot passing longitudinally of the gap 13 between the input and output microstrip lines 11 and 12. The slot 23 extends through the ceramic wafer 16 for exposing the common ground plane conductor 9 at the bottom surface of the wafer 16. An electrically conductive wire 24, as of 0.015 inch in diameter, is placed within the slot 23 to extend substantially the entire length of the slot 23 and is brazed to the common conductor 9 underlaying the input and output strip line sections 11 and 12. In this manner, the wire 24, as of nickel, forms an electrically conductive strip terminal to which wire leads may be bonded, as described below.

A transistor die 25, as of 0.003 inch in thickness, 0.030 inch in width and 0.090 inch in length, is mounted overlaying the output strip conductor 15 of the strip line structure 8. The die 25 includes a collector electrode structure covering the lower major surface thereof facing the output strip conductor 15 and is bonded to the output conductor 15 in electrically conductive and in thermal exchanging relation therewith for heat sinking the die 25 to the microstrip line structure 8 and thence via the base plate 5 to the heat sink 2.

The upper major surface of the die 25 includes emitter and base pads electrode portions to which sets of conductive leads 26 and 27 are bonded. The leads 26 and 27 are arrayed in two sets. The first set of leads 26 interconnects the input strip line conductor 14 with a corresponding input electrode pad of the transistor die which may be either the base or the emitter electrode pad depending upon whether a common base or a common emitter transistor is desired. The second set of leads 27 is bonded between the common terminal strip 24 and the appropriate electrode pad, either the emitter or base pad, respectively. In a common base configuration, the base electrode pads on the die 25 are connected to the common terminal strip 24, whereas in a common emitter configuration the emitter electrode pads are bonded to the common strip terminal 24.

The input set of leads 26 are substantially parallel to the common leads 27 and interdigitated therewith, such that the two sets of leads 26 and 27 are arrayed in an alternating sequence to reduce the self inductance of the common leads. The common lead inductance is reduced by virtue of the following relationship:

$$L'_c = L_c + M_{io} - M_{ic} - M_{oc}$$

where, $L'_c$ is the effective common lead inductance, $L_c$ is the common lead leakage inductance, $M_{io}$ is the mutual inductance input to output, $M_{ic}$ is the mutual inductance input to common, and $M_{oc}$ is the mutual inductance output to common.

By closely spacing and interdigitating the input and common leads 26 and 27, respectively, a relatively high value for $M_{ic}$ is obtained. By closely spacing the output lead 15 to the common lead 29 and 9 the value of $M_{oc}$ is relatively high. Moreover, the input leads and common leads 26 and 27 are relatively short being only approximately 0.045 inch long. Thus these high values for $M_{ic}$ and $M_{oc}$ cancel $L_c$ and $M_{io}$ to yield a low value for $L'_c$ and thus a substantially increased value of power gain for the transistor.

A cup-shaped ceramic cap 28, as of alumina or beryllia ceramic, is hermetically sealed over the die in the inverted position to provide an hermetically sealed transistor package 1. The cap 28 is sealed, as by epoxy impregnated glass, between the lip of the cap 28 and the upper surface of the metalized wafer 16.

An advantage of the transistor package 1 of the present invention is that the common strip terminal 24, extending across the inner ends of the input and output microstrip lines 11 and 12, reduces the coupling between the input and output circuit. Fabrication of the transistor package 1 is facilitated by use of the planar strip line structure 8 and the strip terminal 24 which permits mounting of the transistor die 25 and bonding of the wires 26 and 27 in substantially a common plane and in the same direction. Moreover, this design allows the package 1 to accommodate dies 25 having widely varying sizes. In addition, hermetic sealing of the transistor package 1 is facilitated since the cap 28 is sealed substantially to a planar upper surface of the strip line structure 8.

Figure 4:
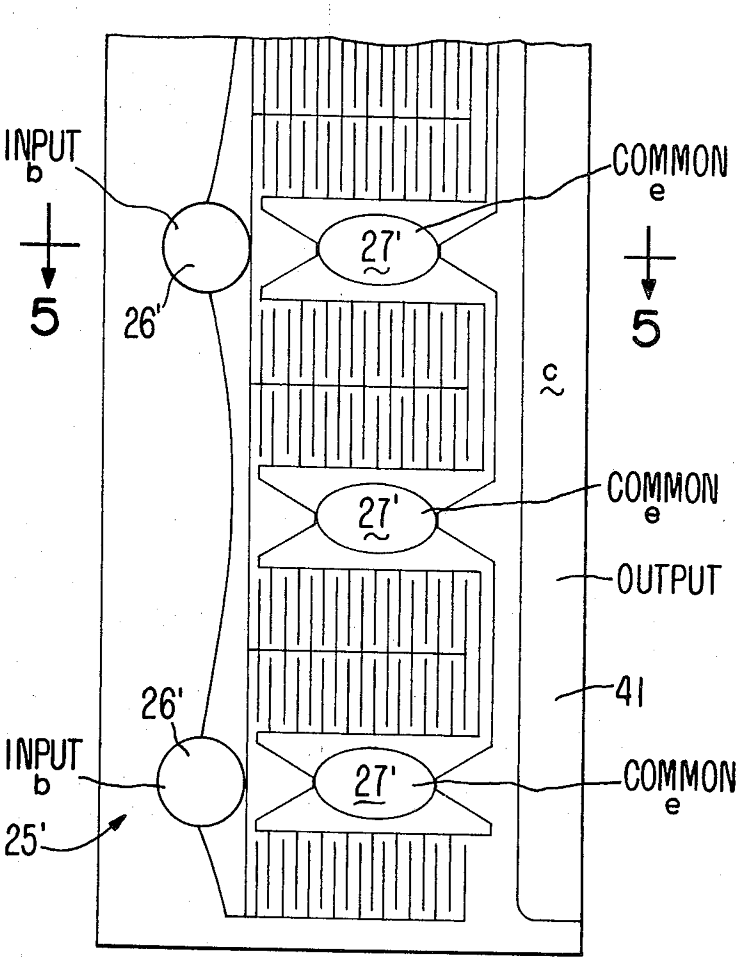
FIG. 4 is an enlarged detail view of a portion of the structure of FIG. 2 delineated by line 4—4.
Figures 5, 6:
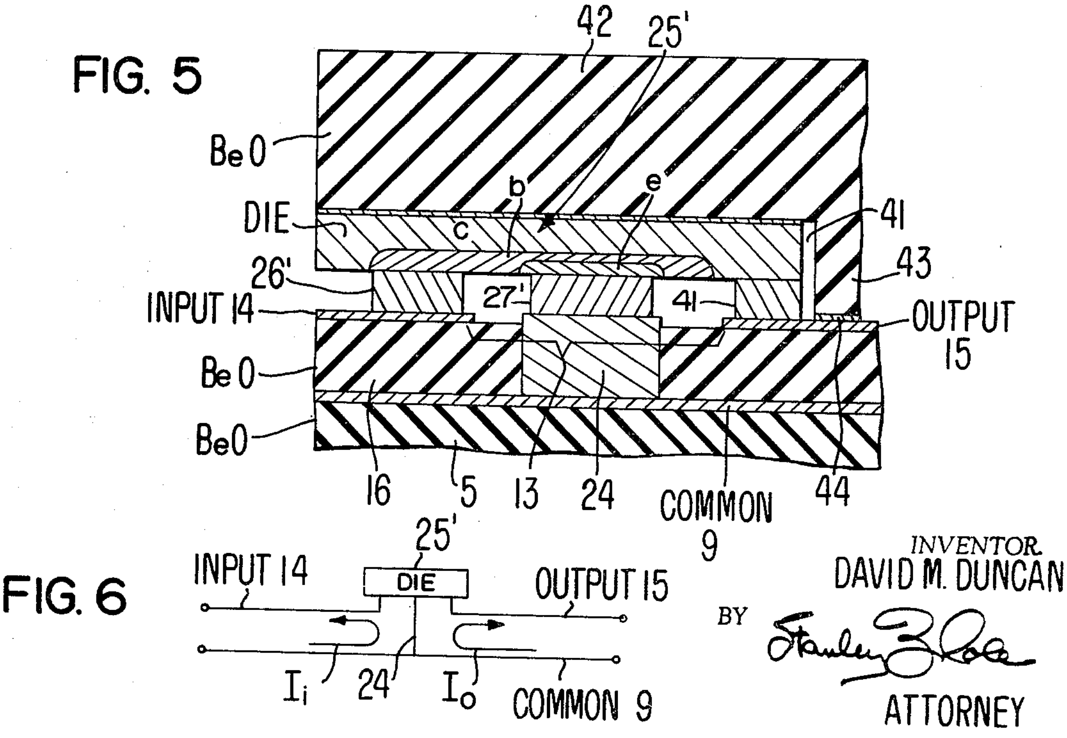
FIG. 5 is an enlarged view of an alternative embodiment to that portion of the structure of FIG. 4 delineated by line 5—5 showing the die of FIG. 4 mounted over a strip line structure of FIG. 1.
FIG. 6 is a schematic circuit diagram, in line diagram form, depicting the electrical circuit for the structure of FIG. 5.

Referring now to FIGS. 4–6, there is shown an alternative embodiment of the present invention. The structure of FIGS. 4–6 is substantially the same as that previously described with regard to FIGS. 1 and 2 with the exception that the transistor die 25' has a collector electrode structure 41 deposited on the same major face of the transistor die 25' as the base and emitter electrodes. The base and emitter electrode structures each have been modified to include raised connector portions 26' and 27' of the respective pad portions of the electrode structures. The connector portions are raised by relatively short heights, as of 0.001–0.005 inch. These connector portions 26' and 27' as well as collector connector 41 terminate in a common plane above the surface of the die 25' and are formed of a suitable electrode material, such as nickel-gold alloy, deposited in the proper position in registration with the respective electrode pad structure, as by evaporation through a suitable mask.

The transistor die 25' is bonded to a suitable heat sinking member such as a metalized beryllia plate 42 which is metalized at the interface between the die and the plate 42 for bonding thereto and which includes a leg portion 43 which extends around the edge of the die 25' and is metalized on its end, at 44, for brazing to the upper surface of the output strip 15.

The heat sinking plate 42 with attached die 25' is bonded in the inverted position across the gap 13 in the strip line structure 8 with the base or emitter connector 26' in registration over the inner end of the input metalized lead 14 and with the collector connector 41 in registration over the inner end of the output lead 15 and with the common connector 27' in registration over the common terminal strip 24 for obtaining electrical connection between the respective connectors and the respective conductors of the strip line structure 8. The equivalent circuit for the structure of FIGS. 4 and 5 is shown in FIGS. 6.

The advantage of the structure of FIGS. 4–6 is that the lead inductances have been reduced to a minimum, thereby improving the gain of the transistor. Moreover, this inverted die configuration has the advantage that leads 26 and 27 do not have to be bonded individually at their ends between the various electrode structure and the strip line. All the connections between the respective electrode structures and the strip line conductors are obtained in a single step, as by ultrasonic bonding. The package is then hermetically sealed in the manner previously described with regard to FIGS. 1 and 2.

The high frequency transistor package of the present invention is particularly useful at frequencies above 25 MHz and well into the S- and X-band range of frequencies, where transistor performance has heretofore been limited due to limitations of the package configuration rather than due to limitations of the transistor device itself.

Although the invention of the present invention has been described as it is employed in a typical transistor package, the term "transistor package" as used herein is to be defined to include integrated circuits and hybrid circuits wherein a transistor die is connected into other circuitry.

What is claimed is:

1. In a radio frequency transistor package, transistor die means having base, emitter and collector regions of semiconductive material, base, emitter and collector electrode structures affixed to said transistor die for making electrical contact to said base, emitter and collector regions, respectively, of said transistor die, strip line means having input and output electrically conductive strips electrically isolated from each other for dc potential and disposed overlaying a common electrically conductive member in spaced relation therefrom for defining input and output strip lines, respectively, dielectric slab means interposed between said input and output conductive strips and said common conductive member to define dielectric filled sections of input and output strip line, said input and output conductive strips having mutually opposed edges spaced apart to define an elongated gap therebetween, said transistor die means being mounted overlaying said strip line means, output connector means electrically interconnecting said output conductive strip and said collector electrode structure, input connector means electrically interconnecting said input conductive strip and one of said base and emitter electrode structures, common connector means electrically interconnecting said common conductive member and the other one of said base and emitter electrodes, and said common connector means having at least a portion thereof interposed in the elongated gap between said input and output conductive strips.

2. The apparatus of claim 1 wherein said dielectric filled input and output strip lines are each dimensioned to have a characteristic impedance less than 20 ohms.

3. The apparatus of claim 1 wherein said strip line means includes a ceramic wafer structure, said ceramic wafer structure being bonded to a metallic layer on one major face thereof to form the common conductive member of said strip line, and said wafer structure having a pair of metalized strips on the second major face of said wafer which is opposed to said first face to form said input and output conductive strips of said input and output strip lines.

4. The apparatus of claim 3 wherein said ceramic wafer structure is apertured in registration with said elongated gap between the opposed edges of said input and output strip conductors to accommodate said common electrical connector means, and wherein said common electrical connector means includes an elongated electrically conductive terminal strip means extending longitudinally of said elongated gap between said input and output strip conductors and upstanding from said common conductive member by a sufficient distance to extend substantially through said aperture in said ceramic wafer structure.

5. The apparatus of claim 4 wherein said common electrical connector means also includes a plurality of wire leads interconnecting the respective electrode structure on said transistor die and said terminal strip means.

6. The apparatus of claim 4 wherein said transistor die means comprises a wafer having a pair of opposed major faces with said collector electrode structure on one major face and said base and emitter electrodes on the other major face, and wherein said die is mounted overlaying said output strip conductor in electrical contact with and in heat exchanging relation therewith, and wherein said input and common electrical connector means each includes a plurality of electrically conductive wires interconnecting said electrode structures and said common terminal strip means and said input strip conductor.

7. The apparatus of claim 6 wherein said electrically connecting wires are generally directed transversely of said elongated gap between the opposed edges of said input and output conductive strips.

8. The apparatus of claim 7 wherein said wires are arranged in an alternating sequence such that said common interconnecting wires alternate with the input connecting wires as taken in a direction longitudinally of said elongated gap.

9. The apparatus of claim 4 wherein said transistor die means comprises a semiconductive wafer having a pair of opposed major faces with said collector, base and emitter electrode structures disposed on a common major face of said semiconductive wafer, and wherein said die is mounted overlaying said strip line means with said common major face of said semiconductive wafer facing toward and overlaying said strip line means with said collector electrode structure in registration with and in electrical contact with said output strip conductor, and said die bridging said elongated gap between the opposed edges of said input and output strip conductors of said strip line means.

10. The apparatus of claim 9 wherein said input and common electrical connector means for making electrical connection between said input conductive strip and said common terminal strip includes, electrically conductive bumps on said common major face of said transistor die, said conductive bumps being disposed in registration with the respective input conductive strip and common terminal strip to which said connector means is to make electrical contact.

* * * * *